(12) United States Patent
Wu

(10) Patent No.: US 7,253,449 B2
(45) Date of Patent: Aug. 7, 2007

(54) LIGHT SOURCE MODULE OF LIGHT EMITTING DIODE

(75) Inventor: Meng-Chai Wu, Hsin-Chu (TW)

(73) Assignee: AU Optronics Corporation, Hsinchu (TW)

( * ) Notice: Subject to any disclaimer, the term of this patent is extended or adjusted under 35 U.S.C. 154(b) by 132 days.

(21) Appl. No.: 11/173,097

(22) Filed: Jul. 1, 2005

(65) Prior Publication Data

US 2006/0197101 A1 Sep. 7, 2006

(30) Foreign Application Priority Data

Feb. 18, 2005 (TW) ............................ 94104800 A

(51) Int. Cl.
*H01L 29/22* (2006.01)
(52) U.S. Cl. .......................................... 257/99; 257/712
(58) Field of Classification Search .................. 257/79, 257/99, 100, 712
See application file for complete search history.

(56) References Cited

U.S. PATENT DOCUMENTS

| 6,501,103 | B1 | 12/2002 | Jory et al. | |
| 7,129,103 | B2 * | 10/2006 | Tanaka | 438/22 |
| 2002/0177099 | A1 | 11/2002 | Cao | 433/29 |

FOREIGN PATENT DOCUMENTS

TW 474032 11/1989

* cited by examiner

*Primary Examiner*—Mark V. Prenty
(74) *Attorney, Agent, or Firm*—Birch, Stewart, Kolasch & Birch, LLP

(57) ABSTRACT

A light source module for a light emitting diode (LED) is provided. In the present invention, a common printed circuit board (PCB) is utilized to provide electric current and isolated from the heat dissipation mechanism, and the thermal conductive element, protruding from the LED package structure, is connected to another thermal conductive element to dissipate out the internal heat.

24 Claims, 4 Drawing Sheets

LIGHT SOURCE MODULE OF LIGHT EMITTING DIODE

This application claims the benefit of Taiwan application Serial No. 94104800, filed Feb. 18, 2005, the subject matter of which is incorporated herein by reference.

FIELD OF THE INVENTION

The present invention relates to a light source module, and more particularly relates to a light source module of the light emitting diode (LED).

DESCRIPTION OF THE RELATED ART

Light emitting diode (LED) is a common lighting element. It can be used as an instructor light in the electrical products, or the high power LED can be used for lighting, for example, the high power LED is often used as the backlight for the display devices. However, the lighting efficiency and the life of the LED are affected by the design of the heat dissipation of the light source module. When the LED is in high temperature of the working environment, the light output efficiency will be reduced. By increasing the input current of the power merely products more heat but the temperature of the LED increases, and eventually results in permanent damage.

A light source module, having LEDs as lighting elements, usually contains an LED package structure and a printed circuit board (PCB) for transmitting input power. In order to provide a good heat dissipation efficiency, the PCB with good heat conductive efficiency, such as a metal-base PCB and so on, can be chosen to applied in the LED package structure. Referring to FIG. 1A and FIG. 1B, showing cross-sectional view of an LED package structure disposed in a metal-base PCB 16 and a top plan view showing an LED package structure before being encapsulated on a metal-base PCB 16. The LED package structure includes a base 11, an LED chip 12, a first thermal conductive element 13 applied in the LED chip 12, a lead 14 electrically connected to the LED chip 12 and metal-base PCB 16, and a package colloid 15 encapsulated the LED chip 12. Metal-base PCB 16 includes a conductive layer 16A, a dielectric layer 16B, and a substrate 16C, which may be made of metal or other materials for heat dissipation.

Still referring to FIG. 1A, in order to dissipate out the heat in the LED package structure, the first thermal conductive element 13 applied in with LED chip 12 is become the path of the thermal conductivity, which is inserted through the bottom 11A of the base 11 and contacted directly with the metal-base PCB 16. Therefore, the heat can be conducted in sequence of the conductive layer 16A, the dielectric layer 16B, and the substrate 16C and finally dissipate out through the external heat sink attached on the metal-base PCB 16.

By considering the heat dissipation problem, the light source module of the related art has a metal-base PCB 16, with good thermal conductivity, applied in the LED package structure. However, the cost of this kind of PCBs is very expensive, and it is not guaranteed that the heat can be conducted efficiently in the process of the multi-layers conduction. For example, the conductive layer 16A connected with the first thermal conductive element 13 is usually in high temperature but cannot conduct the heat as soon as possible to the dielectric layer 16B which is in the lower place and increase the temperature of the LED package structure. It should be noted, referring to FIG. 1A and FIG. 1B, in the light source module of the related art, the LED chip 12 must be cooperated with the first thermal conductive element 13 and the metal-base PCB 16 that has bigger volume than the LED chip 12 in order to dissipate the heat out. Therefore on the one hand, the volume of the LED package structure is too hard to be reduced and cannot be fit in with the trend of the development to smallize the electrical products and on the other hand it would increase the cost of production of the whole light source module and would have to use expensive metal-base PCB 16.

SUMMARY OF THE INVENTION

It should be noted that the electrical products are become smaller and smaller, the light emitting diode (LED) is chosen to be the light source module of the lighting device. However, the size cannot be decreased because the heat dissipation problem and the expensive metal-base printed circuit board (PCB) must be applied in the LED package structure. The light source module design of the lighting device has an LED provided herein, one of the purposes is to provide an efficient heat dissipation structure and is not necessary to use expensive or heavy PCB applied in the LED package structure. And the volume of the light source module also may be reduced to fit in the trend of the development of the smallization.

According to the goal of above description, LEDs are applied in a light source module of the lighting device in the present invention. Wherein the PCB transmitting the input power is isolated at the outside of the heat dissipation of the LED package structure. And the first thermal conductive element is connected thermally to the second thermal conductive element in the LED package structure. Therefore, the light source module only has to apply a conventional PCB to execute the operation of the input power and the heat dissipation structure can be simplified in the LED package structure and then reduce the size of the whole light source module.

DETAILED DESCRIPTION

The following is the detail description of the present invention. It should be noted and appreciated that the process steps and structures described below does not cover a complete process flow and structure. The present invention can be practiced in conjunction with various fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1A:
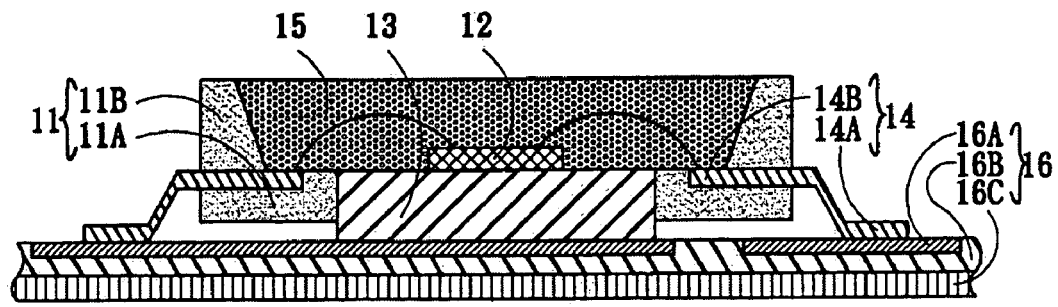
FIG. 1A is a cross-sectional view illustrating a light emitting diode package structure of the related art, which is disposed in the metal-based printed circuit board.
Figure 1B:
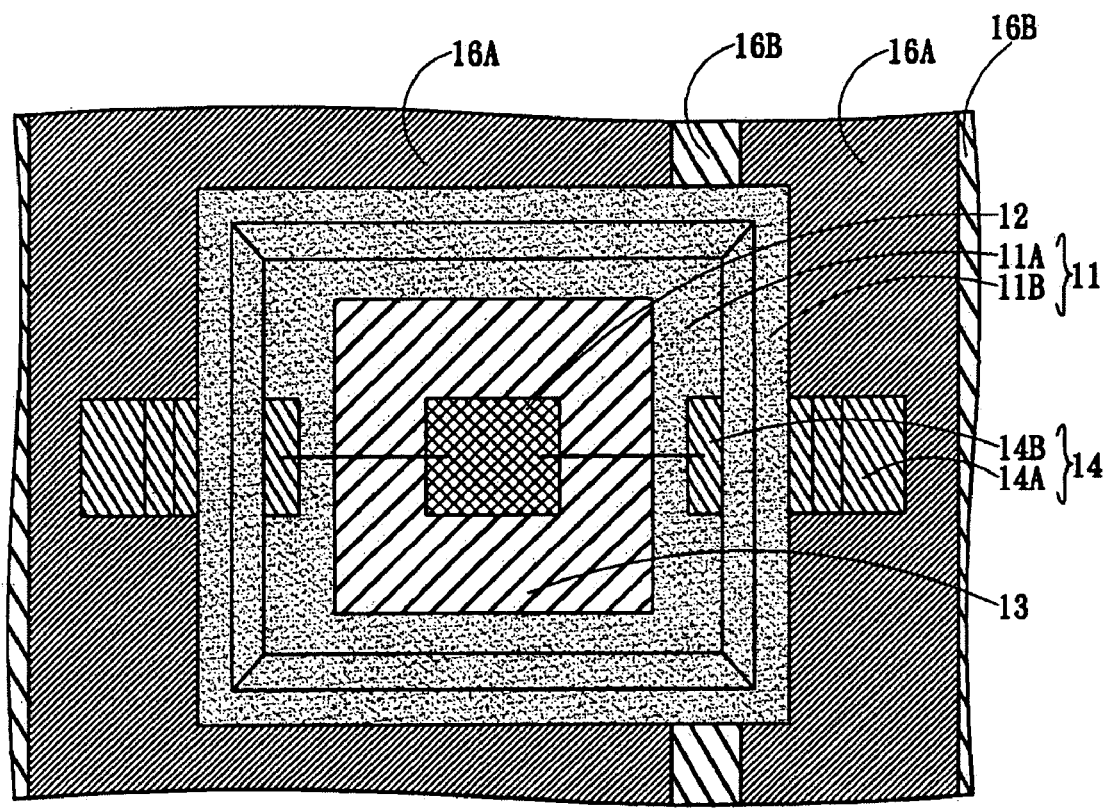
FIG. 1B is a top plan view illustrating a light emitting diode package structure of the related art, which is disposed in a metal-based printed circuit board before encapsulating.
Figure 2A:
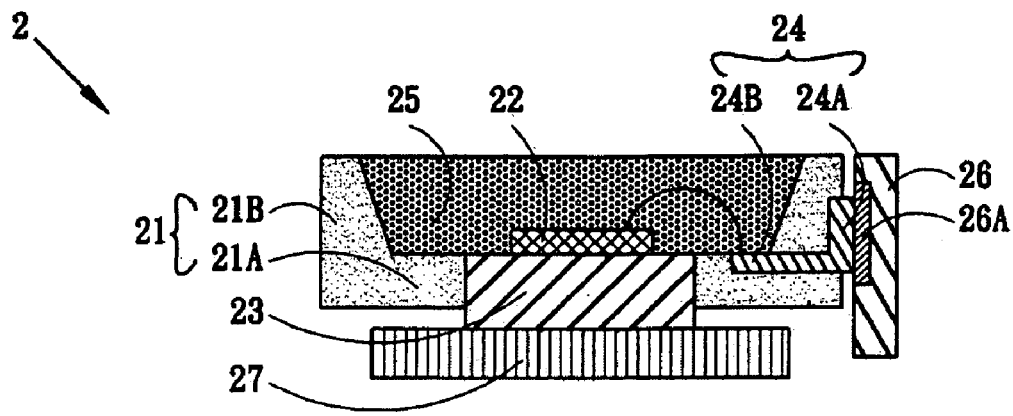
FIG. 2A is a cross-sectional view illustrating an LED light source module in accordance with a preferred embodiment of the present invention, wherein the light emitting diode package structure is disposed in a printed circuit board.
Figure 2B:
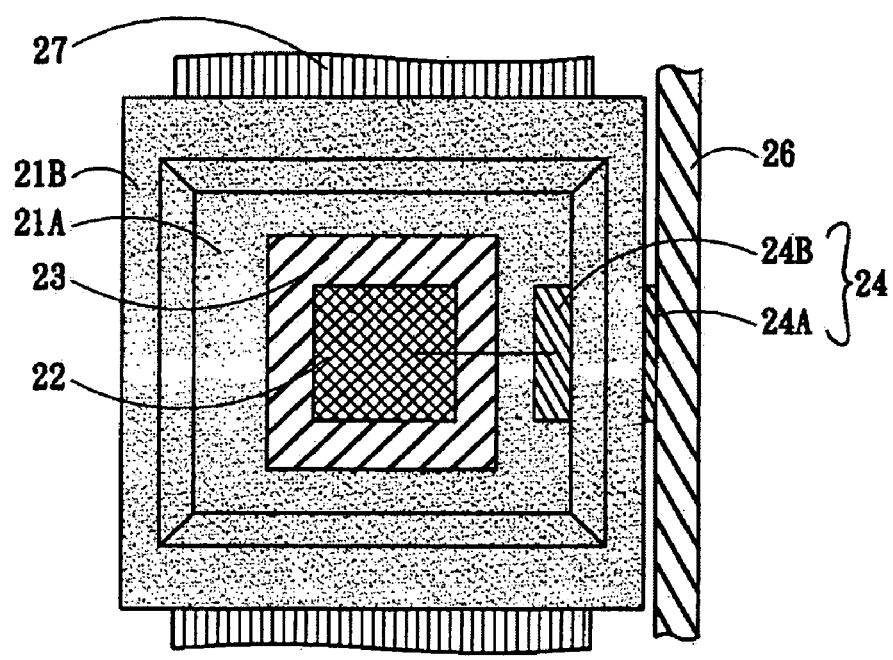
FIG. 2B is a top plan view illustrating an LED light source module in the preferred embodiment of the present invention, wherein the light emitting diode package structure is disposed in a printed circuit board before encapsulating.

In a preferred embodiment of the present invention, a light source module of the light emitting diode (LED) 2 is provided which includes an LED package structure and a printed circuit board 26 (PCB) for transmitting the input power to LED chip 22. Referring to FIG. 2A and FIG. 2B, there is a cross-sectional view showing an LED package structure of the light source module of the LED 2 disposed in a metal-base PCB 26 and a top plan view showing an LED package structure disposed in a PCB 26 before encapsulated. An LED package structure is composed of a base 21, an LED chip 22, a first thermal conductive element 23, a lead 24 electrically connected to the LED chip 22 and the PCB 26, and a package colloid 25 encapsulating the LED chip 22. Conductive layer 26A is disposed at side of the PCB 26, which is electrically connected to the LED package structure to provide enough power for what the LED package structure needs.

Still referring to FIG. 2A, base 21 may be cup-shape. A bottom 21A and a sidewall 21B, with a slide surface or a reflective surface connected to the surrounding of the bottom 21A, define a contained space. The heat conductive structure of the LED package is that the first thermal conductive element 23 inserted through the bottom 21A is extended to the outside of the base 21 in order to contact with a second thermal conductive element 27. Material of the first thermal conductive element and the second thermal conductive element may have good heat conduction such as metal. Power input to the LED package structure may be via lead 24, which is inserted in the sidewall 21B being a media to electrically connect with the electricity in the LED chip 22, such as an anode, and the internal lead 24B disposed in the volume space by the method of wire bonding. The external lead 24A extending to the outside of the base 21 is electrically connected to the conductive layer 26A on the PCB 26. The first thermal conductive element 23 may be cathode.

The light source module 2 of the LED in the present invention, the PCB 26 is used only to provide the power input for the LED package structure. PCE 26 may be normal fiberglass PCB or flexible PCB (FPC). The heat within the LED package structure may be conducted from the first thermal conductive element 23 to the second thermal conductive element 27 and then dissipates out. The heat dissipation structure of the LED package is simpler, more efficiency and cheaper than the related art using the metal-based PCB and also reduced the size of the LED package structure at the same time. In order to have the flexibility in size of the application in the light source module 2 of the light emitting diode of the present invention, and in the embodiment, the lead 24 including external lead 24A and internal lead 24B, referring to the FIG. 2A, may be bended in 90 degree and inserted in the sidewall 21B. Therefore, lead 24 may be mount on conductive layer 26A by using Surface Mount Technology (SMT) and the arrangement of the PCB 26 can be changed to reduce the wide of the whole light source module 2 of the LED by the design of the parallel direction of the light output.

Figure 2C:
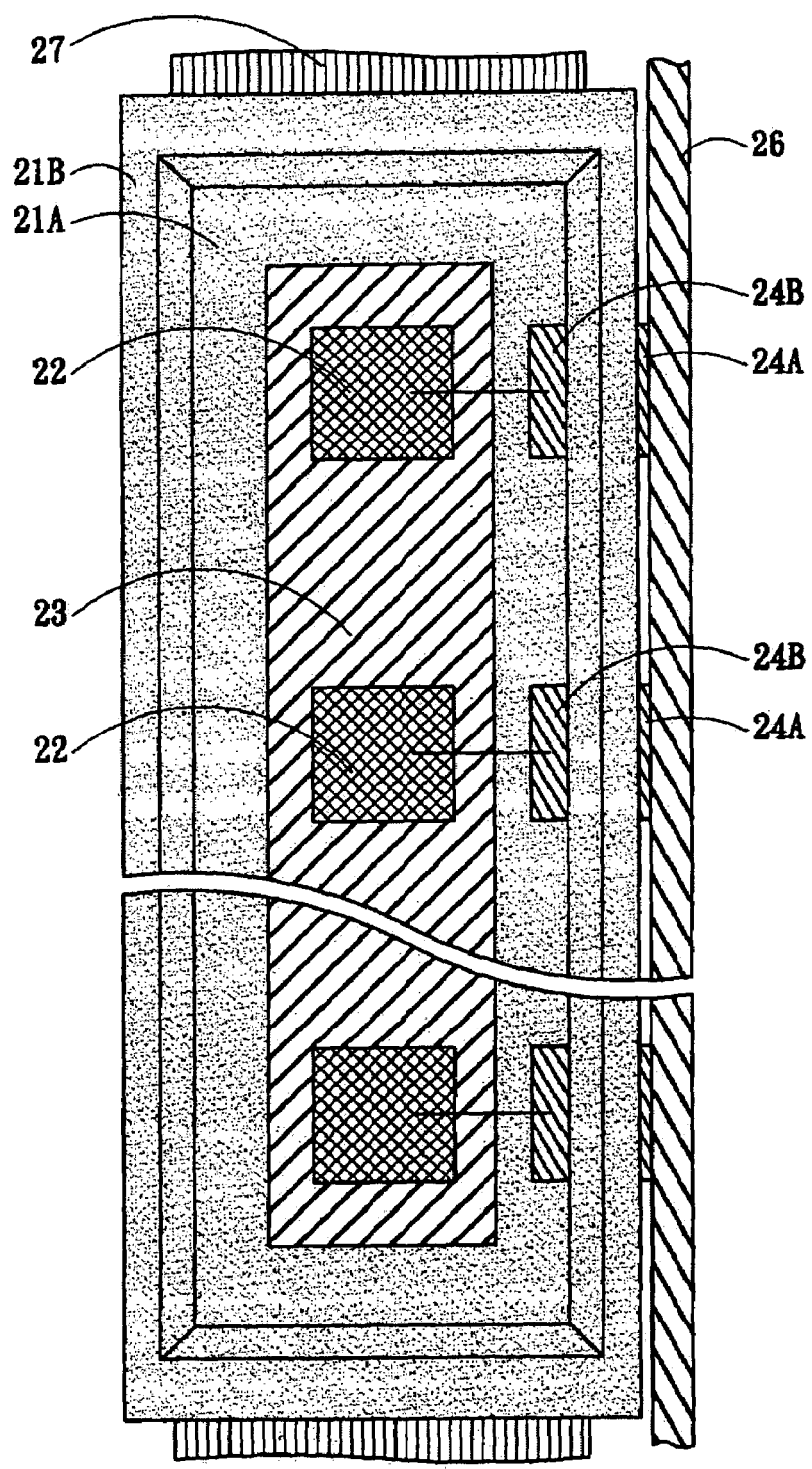
FIG. 2C is a cross-sectional view illustrating an LED light source module of the present invention, wherein a plurality of light emitting diodes are disposed in the package structure.

In the other embodiments of the present invention, there may be a plurality of LED chips put in one LED package structure, for example in the FIG. 2C, a plurality of the LED chips 22 in the same package structure are stick on the first thermal conductive element 23 and sharing same plane of the first thermal conductive element 23, but the current input is entered by the different internal leads 24B and is activated independently and controlled. This kind of bar like light source module of the LED is good to be used as a backlight source with sidelight emitting style in the small size display.

Figure 2D:
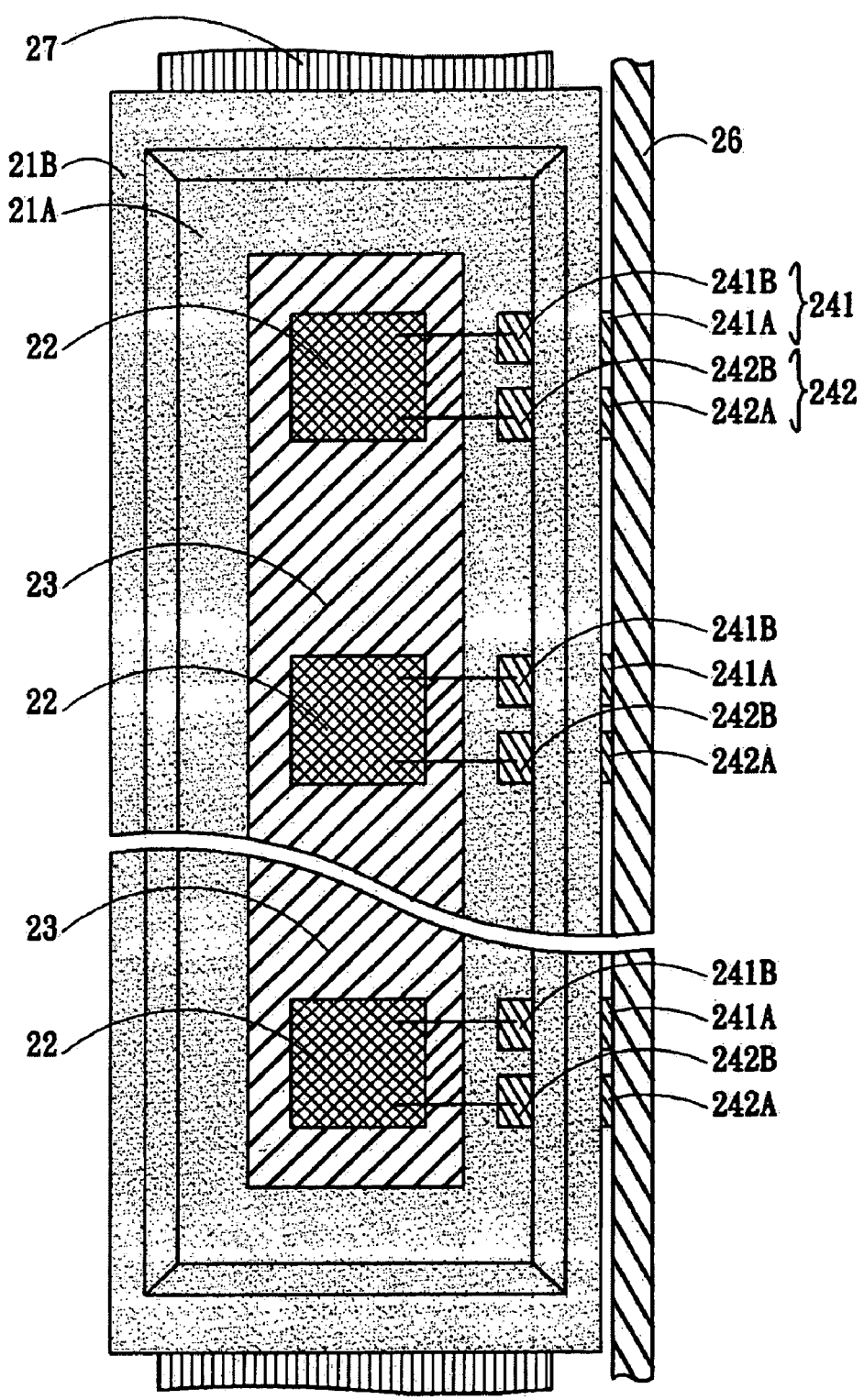
FIG. 2D is a top plan view illustrating the heat conductive structure and the electrical conductive structure are separated, in accordance with a preferred embodiment of the present invention.

Referring to FIG. 2B, in the embodiment, the anode of the LED chip 22 is wire bonding to the internal lead 24B and conducts the current from the PCB 26. Cathode of the LED chip 22 may be stuck directly on the thermal conductive element 23 and may be considered ground. However, in other embodiments of the present invention, the heat and electricity conduction structure in the LED package structure may be separated and the PCB 26 is for the input and output of the current and isolated from the first thermal conductive element 23 that is for heat conduction. Therefore, the LED chip 22 is corresponding to two leads inserted into the sidewall 21B, referring to FIG. 2D, the anode of the LED chip 22 is corresponding to the first lead 241 and the cathode of the LED chip 22 is corresponding to the second lead 242. After wire bonding the first internal lead 241B and the second internal lead 242B, the first external lead 241A and the second external lead 242A can be electrically connected to the PCB 26.

The foregoing description is not intended to be exhaustive or to limit the invention to the precise forms disclosed. Obvious modifications or variations are possible in light of the above teachings. In this regards, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A light source module for a light emitting diode, comprising:
   a substrate having a bottom and a sidewall;
   a printed circuit board having a conductive layer disposed adjacent to the sidewall;
   a first thermal conductive element connected to the bottom of the substrate; and
   at least one light emitting diode chip disposed on said first thermal conductive element and electrically connected to the conductive layer.

2. The light source module of claim 1, wherein said first thermal conductive element is physically isolated from said printed circuit board.

3. The light source module of claim 1, further comprising a lead inserted into the sidewall and electrically connected to the light emitting diode chip and the conductive layer.

4. The light source module of claim 3, wherein the anode of said light emitting diode chip is electrically connected to the lead, and the cathode of said light emitting diode chip is electrically connected to said first thermal conductive element.

5. The light source module of claim 1, further comprising a first lead and a second lead inserted into the sidewall and electrically connected to the conductive layer, wherein the first lead is electrically connected to the anode of the light emitting diode chip, and the second lead is electrically connected to the cathode of the light emitting diode chip.

6. The light source module of claim 5, further comprising a package colloid, disposed on said substrate, for encapsulating said light emitting diode chip.

7. The light source module of claim 1, further comprising a package colloid, disposed on said substrate, for encapsulating said light emitting diode chip.

8. The light source module of claim 7, further comprising a second thermal conductive element thermally connected to said first thermal conductive element.

9. The light source module of claim 1, further comprising a second thermal conductive element thermally connected to said first thermal conductive element.

10. The light source module of claim 1, wherein said light emitting diode chip is physically isolated from said first thermal conductive element.

11. The light source module of claim 1, wherein said first thermal conductive element comprises metal.

12. The light source module of claim 1, wherein said printed circuit board comprises a fiberglass printed circuit board.

13. The light source module of claim 1, wherein said printed circuit board comprises a flexible printed circuit board.

14. A light source module for a light emitting diode, comprising:
   a substrate having a bottom and a sidewall;
   a printed circuit board having a conductive layer;
   a first thermal conductive element thermally connected to said substrate, the first thermal conductive element being inserted through the bottom of the substrate and isolated from said printed circuit board; and
   at least one light emitting diode chip disposed on said first thermal conductive element and electrically connected to the conductive layer.

15. The light source module of claim 14, further comprising a lead inserted into said sidewall and electrically connected to the light emitting diode chip and the conductive layer.

16. The light source module of claim 15, wherein the lead includes an internal lead inserted into the sidewall and an external lead extended to the sidewall and electrically connected to the conductive layer.

17. The light source module of claim 15, wherein the anode of said light emitting diode chip is electrically connected to the lead, and the cathode of said light emitting diode chip is electrically connected to said first thermal conductive element.

18. The light source module of claim 14, further comprising a first lead and a second lead inserted into the sidewall and connected to the conductive layer, wherein the first lead is connected to the anode of the light emitting diode chip, and the second lead is connected to the cathode of the light emitting diode chip.

19. The light source module of claim 14, further comprising a package colloid, disposed on the substrate, for encapsulating said light emitting diode chip.

20. The light source module of claim 14, further comprising a second thermal conductive element connected to said first thermal conductive element.

21. The light source module of claim 14, wherein said light emitting diode chip is physically isolated from said first thermal conductive element.

22. The light source module of claim 14, wherein said first thermal conductive element comprises metal.

23. The light source module of claim 14, wherein said printed circuit board comprises a fiberglass printed circuit board.

24. The light source module of claim 14, wherein said printed circuit board comprises a flexible printed circuit board.

* * * * *